United States Patent
Grynkewich et al.

(10) Patent No.: US 6,798,004 B1
(45) Date of Patent: Sep. 28, 2004

(54) MAGNETORESISTIVE RANDOM ACCESS MEMORY DEVICES AND METHODS FOR FABRICATING THE SAME

(75) Inventors: Gregory W. Grynkewich, Gilbert, AZ (US); Brian R. Butcher, Gilbert, AZ (US); Mark A. Durlam, Chandler, AZ (US); Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/421,095

(22) Filed: Apr. 22, 2003

(51) Int. Cl.[7] .............................................. H01L 29/76
(52) U.S. Cl. ............................ 257/295; 257/421; 438/3
(58) Field of Search ................................. 257/295, 421, 257/422; 438/3

(56) References Cited

U.S. PATENT DOCUMENTS 5,734,605 A    3/1998  Zhu et al.
6,165,803 A  * 12/2000  Chen et al. ................... 438/3
6,365,419 B1 *  4/2002  Durlam et al. ................ 438/3
6,555,858 B1 *  4/2003  Jones et al. ................ 257/295

* cited by examiner

*Primary Examiner*—Richard Elms
*Assistant Examiner*—Brad Smith
(74) *Attorney, Agent, or Firm*—Ingrassia Fisher & Lorenz PC

(57) ABSTRACT

Fabricating a magnetoresistive random access memory cell and a structure for a magnetoresistive random access memory cell begins by providing a substrate having a transistor formed therein. A contact element is formed electrically coupled to the transistor and a dielectric material is deposited within an area partially bounded by the contact element. A digit line is formed within the dielectric material, the digit line overlying a portion of the contact element. A conductive layer is formed overlying the digit line and in electrical communication with the contact element.

16 Claims, 3 Drawing Sheets

US 6,798,004 B1

MAGNETORESISTIVE RANDOM ACCESS MEMORY DEVICES AND METHODS FOR FABRICATING THE SAME

FIELD OF THE INVENTION

The present invention generally relates to magnetoelectronic devices, and more particularly relates to memory cell structures and methods for fabricating memory cell structures for magnetoresistive random access memory devices wherein the memory cell structures utilize a contact to an underlying conductive layer for a memory element wherein the contact partially bounds a programming line.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. Magnetoresistive random access memory (MRAM) devices are well-known magnetoelectronics information devices.

The architecture for MRAM devices is composed of an array of memory cells. Each memory cell comprises a memory element (e.g., a giant magnetoresistance (GMR) element or a magnetic tunnel junction (MTJ) element) in electrical communication with a transistor through an interconnect stack. The memory elements are programmed by the magnetic field created from current-carrying conductors. Typically, two current-carrying conductors, the "digit line" and the "bit line", are arranged in cross point matrix to provide magnetic fields for programming of the memory element. Because the digit line is formed underlying the memory element so that the memory element may be magnetically coupled to the digit line, the interconnect stack that couples the memory element to the transistor typically is formed, using standard CMOS processing, offset from the memory element. Such a configuration may consume valuable real estate in the MRAM device.

Accordingly, it is desirable to provide a method for fabricating a compact magnetoresistive random access memory cell. In addition, it is desirable to provide a structure and a method for improving the density of MRAM cells in a memory array by reducing the area of individual MRAM cells. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
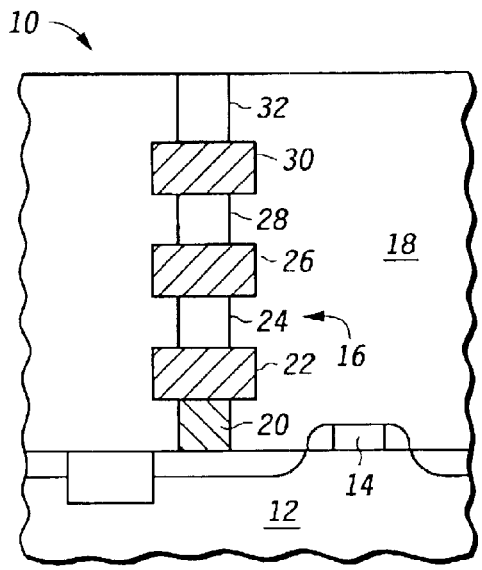
FIG. 1 illustrates schematically, in cross section, an interconnect of a partially fabricated memory cell as is known in the prior art.

FIG. 1 is a cross-sectional view of a portion of a partially fabricated memory cell 10 of an MRAM device. Here it should be understood that, while only a single memory cell is illustrated for convenience, generally a complete array of cells (or arrays of cells) will be formed simultaneously to form an MRAM device. The method begins by providing a semiconductor substrate 12, such as, for example, a silicon substrate, having a plurality of transistors 14, such as switching and/or isolation transistors. Other circuit elements, for example, an input/output circuit, a data/address decoder, and comparators, may be contained in the MRAM device; however, they are omitted from the drawings for simplicity.

In accordance with a standard and well known CMOS process, an interconnect stack 16 of vias and metallization layers is formed in a stack formation overlying substrate 12, and typically within one (or more) sub-dielectric layer 18, to provide the interconnections for the integrated circuit and the memory device array in which memory cell 10 is included. Interconnect stack 16 is formed by providing dielectric layers, masking and etching, and metal deposition all in a well-known manner. Also in accordance with the standard and well known process, the metal including the first via on the source and drain terminals of transistor 14 is referred to as the contact layer 20 (CNT). The metallization layer forming the first layer of interconnect is referred to as the first metallization layer 22 (M1). A via formed on layer M1 22 is referred to as the first via layer 24 (Via1), the next metallization layer is the second metallization layer 26 (M2), followed sequentially by a second via layer 28 (Via2), a third metallization layer 30 (M3), and as many, more or less, additional via layers and metallization layers as are needed to provide the desired interconnect for the specific apparatus and applications. While interconnect stack 16 is shown with two via layers and three metallization layers, it will be understood that interconnect stack 16 may have any suitable number of via layers and metallization layers. A final via 32, in a layer designated BVia, is provided for connecting transistor 14 ultimately to a memory element, to be explained presently.

Figure 2:
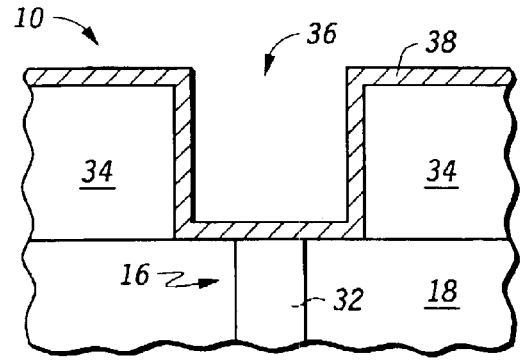
FIGS. 2–9 illustrate schematically, in cross section, a method for fabricating a memory cell of a magnetoresistive random access memory device in accordance with an exemplary embodiment of the present invention.

Referring to FIG. 2, a first dielectric layer 34 is deposited overlying interconnect stack 16 and sub-dielectric layer 18. First dielectric layer 34 may comprise any suitable dielectric material including silicon dioxide ($SiO_2$), silicon nitride ($Si_3N_4$), tetraethyl orthosilicate-derived silicon dioxide (TEOS), plasma-enhanced nitride (PEN) and the like. First dielectric layer 34 then may be patterned and etched using any technique well known in the semiconductor industry to form a first trench 36 that exposes BVia 32 of interconnect 16. For example, a photoresist layer (not shown) may be formed overlying first dielectric layer 34 and developed using standard photolithography techniques so that first dielectric layer 34 may be etched using a suitable wet or dry etch chemistry to form first trench 36.

A contact element layer 38 may be suitably deposited overlying first dielectric layer 34 and within first trench 36. Contact element layer 38 may be formed using any suitable deposition process, such as, for example, physical vapor deposition (PVD), ion beam deposition (IBD), atomic layer deposition (ALD), electroplating or electroless plating. Contact element layer 38 may have a thickness of about 50 to about 2000 angstroms. Contact element layer 38 may be formed of any suitable electrically conducting material such as, for example, tantalum (Ta), tungsten (W), titanium (Ti), or aluminum (Al), or combinations or alloys thereof, such as tantalum nitride (TaN), titanium nitride (TiN), or titanium tungsten (TiW). In a preferred embodiment of the invention, contact element layer 38 is formed of a cladding material that has the characteristics of concentrating a magnetic flux produced by current flowing through a subsequently fabricated digit line, to be discussed in detail below. The cladding material may comprise an electrically conducting magnetic material having high permeability, such as nickel iron (NiFe) having a ratio of approximately 80% nickel to 20% iron, or any suitable material having sufficiently high permeability to concentrate the magnetic flux in a desired area and be metallurgically compatible with the remaining material structure.

In another exemplary embodiment of the invention, contact element layer 38 may comprise a first barrier layer that is deposited before a cladding material is deposited. The first barrier layer may be formed of any suitable metal material, such as tantalum, tantalum nitride, titanium nitride, titanium tungsten, or any combination of these materials.

In a further exemplary embodiment of the invention, contact element layer 38 may also comprise a second barrier layer that is deposited after deposition of a cladding material. The second barrier layer may comprise any suitable metal material, such as tantalum, tantalum nitride, titanium nitride, titanium tungsten, or any combination of these materials.

Contact element layer 38 then may be suitably patterned and etched so that a subsequently formed contact element, to be described hereinafter, of magnetic memory cell 10 will be electrically isolated from other simultaneously formed contact elements of other memory cells in the MRAM device. In one exemplary embodiment of the invention, a photoresist layer may be deposited overlying contact element layer 38 and may be suitably patterned and developed using standard photolithographic processes. Contact element layer 38 may then be suitably etched to achieve the aforementioned isolation.

Figure 3:
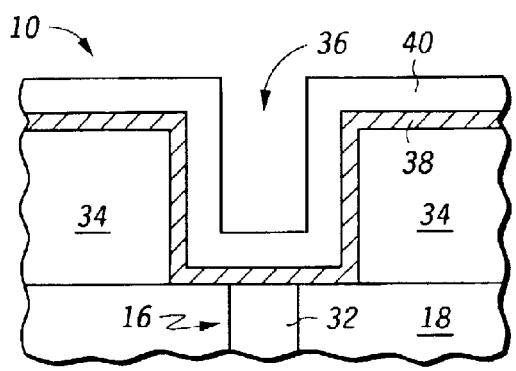
Figure 4:
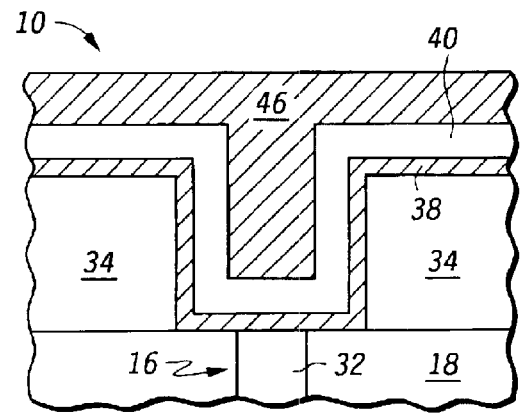
Figure 5:
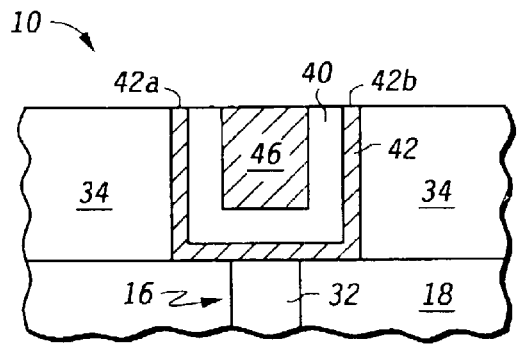

Referring to FIGS. 3–5, in a preferred embodiment of the present invention, a second dielectric layer 40 may be deposited overlying contact element layer 39 and within first trench 36. Second dielectric layer 40 may comprise any of those materials that may form first dielectric layer 34. Second dielectric layer 40 may have a thickness of approximately 100 to 2000 angstroms, preferably about 150 to 1000 angstroms. A conductive material 46 may then be deposited within trench 36 so as to fill trench 36. Conductive material 46 may comprise any suitable conductive material, such as aluminum (Al), aluminum alloys, copper (Cu) and copper alloys.

In an alternative embodiment of the invention, a cladding and/or a barrier layer(s) may be deposited within trench 36 before deposition of conductive material 46. For example, a first barrier layer may be deposited within trench 36, followed by deposition of one or more cladding layers, followed by deposition of a second barrier layer. The barrier layers and cladding layers may comprise any of those materials for the barrier layers and cladding layers described above with reference to FIG. 2.

Any portions of conductive material 46, second dielectric layer 40 and contact element layer 38 overlying first dielectric layer 34 may be removed using any suitable planarization process known in the semiconductor industry, such as, for example, chemical mechanical polishing (CMP) or electrochemical mechanical polishing (ECMP), or any other suitable removal process, such as etching, to allow the formation of contact element 42, which partially surrounds the remaining portion of second dielectric layer 40, and which has a first end 42a and a second end 42b, as illustrated in FIG. 5.

In an alternative embodiment, the portion of contact element layer 38 overlying first dielectric layer 34 may be removed as described above before deposition of second dielectric layer 40. In yet another alternative embodiment, the portions of contact element layer 38 and second dielectric layer 40 overlying second dielectric layer 34 may be removed as described above before deposition of conducting material 46.

Figure 10:
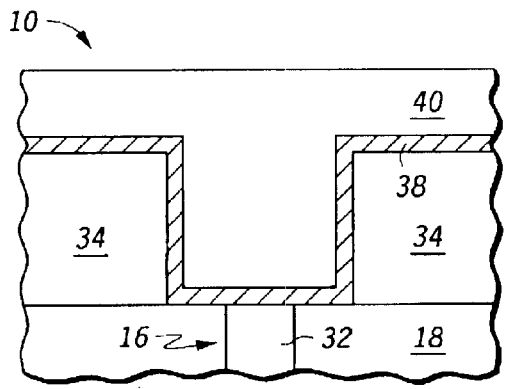
FIGS. 10–12 illustrate schematically, in cross section, another method for fabricating a memory cell of a magnetoresistive random access memory device in accordance with an exemplary embodiment of the present invention.
Figure 11:
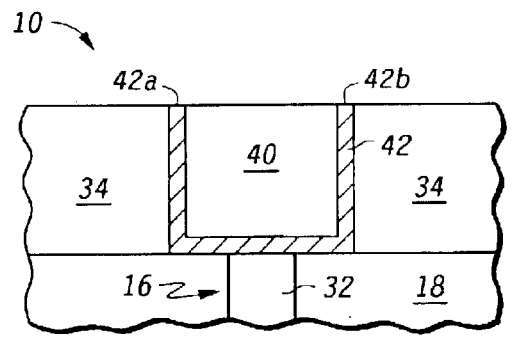
Figure 12:
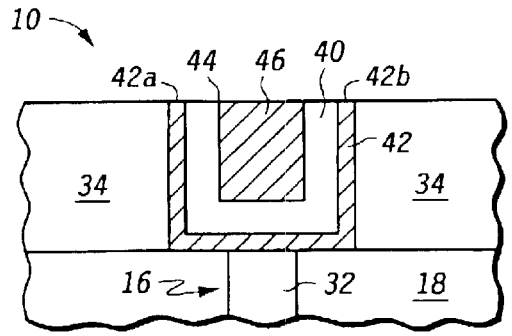

Referring momentarily to FIGS. 10–12, in an alternative embodiment of the invention, second dielectric layer 40 may be deposited overlying contact element layer 38 and may fill first trench 36. A portion of second dielectric layer 40 and that portion of contact element layer 38 overlying first dielectric layer 34 may be removed using any suitable planarization process known in the semiconductor industry, such as, for example, CMP or ECMP, or any other suitable removal process, such as etching, to form contact element 42, which partially surrounds the remaining portion of second dielectric layer 40, and which has first end 42a and second end 42b.

In another alternative embodiment of the present invention, before deposition of second dielectric layer 40, that portion of contact element layer 38 overlying first dielectric layer 34 may be removed using any suitable method, such as, for example, CMP, ECMP or etching, to form contact element 42. Second dielectric layer 40 then may be deposited overlying contact element 42. Any excess of second dielectric layer 40 deposited overlying first dielectric layer 34 may be removed using any suitable method, such as, for example, CMP, to expose first end 42a and second end 42b of contact element 42.

In yet a further alternative embodiment of the present invention, after deposition of contact element layer 38, that portion of contact element layer 38 overlying first dielectric layer 34 may be removed using any suitable method, such as, for example, CMP, ECMP or etching. Contact element layer 38 then may be suitably patterned and etched so that subsequently formed contact element 42 may be electrically isolated from other simultaneously formed contact elements of other memory cells in the MRAM device. Second dielectric layer 40 then may be deposited overlying contact element 42 and any excess of second dielectric layer 40 deposited overlying first dielectric layer 34 may be removed using any suitable method, such as, for example, CMP, to expose first end 42a and second end 42b of contact element 42.

Referring to FIG. 12, a masking layer (not shown), such as a photoresist layer, may be deposited overlying cell 10 and may be suitably patterned so that second dielectric layer 40 may be suitably etched to form a second trench 44. Conductive material 46 may then be deposited within trench 44. Any excess material of conductive material 46 deposited overlying cell 10 may be removed using any suitable technique, such as, for example, CMP, to expose first end 42a and second end 42b of contact element 42.

In an alternative embodiment of the invention, a cladding and/or a barrier layer(s) may be deposited within trench 44 before deposition of conductive material 46. For example, a first barrier layer may be deposited within trench 44, followed by deposition of one or more cladding layers, followed by deposition of a second barrier layer. The barrier layers and cladding layers may comprise any of those materials for the barrier layers and cladding layers described above with reference to FIG. 2.

Figure 6:
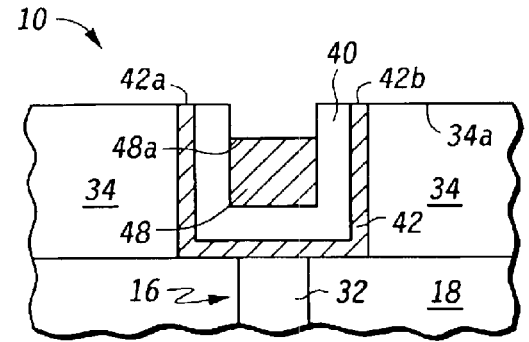

Referring now to FIG. 6, after deposition of conductive material 46 and exposure of ends 42a and 42b of contact element 42 as illustrated in FIGS. 5 and 12, a recess etch is then performed on conductive material 46 to form a digit line 48 for carrying current to alter the state of a subsequently formed memory element, as described below. The recess etch may be performed using any suitable etching process, such as, for example, sputtering, reactive ion etching or a wet etch process using, for example, a solution containing dilute sulfuric acid. The recess etch is performed in a manner so that conductive material 46 is removed at a rate typically three (3) to twenty (20) times faster than the rate at which dielectric layers 34 and 40 are removed. In addition, first and second ends 42a and 42b of contact element 42 are etched at a substantially slower rate than conductive material 46 so that ends 42a and 42b remain substantially planar with or extend beyond surfaces of dielectric layer 34 and 40 The recess etch partially etches conductive material 46 a suitable depth so that a dielectric material may be deposited overlying digit line 48 to electrically isolate digit line 48 from a subsequently formed conductive layer, as discussed in more detail below. In an exemplary embodiment of the invention, conductive material 46 is etched so that digit line 48 has a surface 48a that lies in a plane that is approximately 250 to 1000 angstroms from a surface 34a of first dielectric layer 34.

Figure 7:
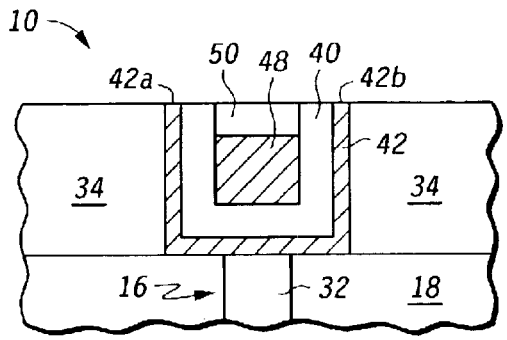

Referring to FIG. 7, a third dielectric layer 50 then is deposited overlying digit line 48. Third dielectric layer 50 may comprise any of the materials that comprise first and second dielectric layers 34 and 40. Any excess of third dielectric layer 50 that is deposited overlying cell 10 may be removed by a suitable planarization process, such as, for example, CMP, so that first end 42a and second end 42b of contact element 42 are exposed. In another exemplary embodiment of the invention, an over-planarization process may be performed to reduce the thickness of third dielectric layer 50 and simultaneously remove material from ends 42a and 42b of contact element 42 and material from dielectric layers 34 and 40 so that digit line 48 may be in closer proximity to, although not in contact with, an overlying bit line, to be discussed in more detail below.

In another exemplary embodiment of the invention, the structure of memory cell 10 illustrated in FIG. 7 may be obtained as follows. After deposition of second dielectric layer 40, such as illustrated in FIG. 10 any excess of second dielectric layer 40 overlying contact element layer 38 may be removed by a suitable planarization method, such as CMP, ECMP, etching or the like, while that portion of contact element layer 38 within first trench 36 and overlying first dielectric layer 34 remains. Second dielectric layer 40 remaining within first trench 36 is then etched as described above to form second trench 44. Conductive material 46 is deposited within second trench 44 and any excess of conductive material 46 is removed by a suitable planarization method, such as CMP, ECMP, etching or the like until contact element layer 38 overlying first dielectric layer 34 is exposed. A recess etch of conductive material 46 is then performed as described above to form digit line 48. As described above, the recess etch partially etches conductive material 46 a suitable depth so that third dielectric layer 50 may be deposited overlying digit line 48 to electrically isolate digit line 48 from a subsequently formed conductive layer, as discussed in more detail below. In an exemplary embodiment of the invention, conductive material 46 is etched so that digit line 48 has a surface 48a that is about 250 to about 1000 angstroms from a surface 34a of first dielectric layer 34. Third dielectric layer 50 is then deposited overlying digit line 48 and any excess of third dielectric layer 50 is removed using a suitable planarization method, such as CMP, ECMP, etching or the like until contact element layer 38 overlying first dielectric layer 34 is exposed. The portion of contact element layer 38 overlying first dielectric layer 34 may then be removed using a suitable planarization method, such as CMP, ECMP, etching or the like, to expose first end 42a and second end 42b of contact element 42. In yet another exemplary embodiment of the invention, the portion of contact element layer 38 overlying first dielectric layer 34 may be removed after removal of conductive material 46 and before the recess etch.

Figure 8:
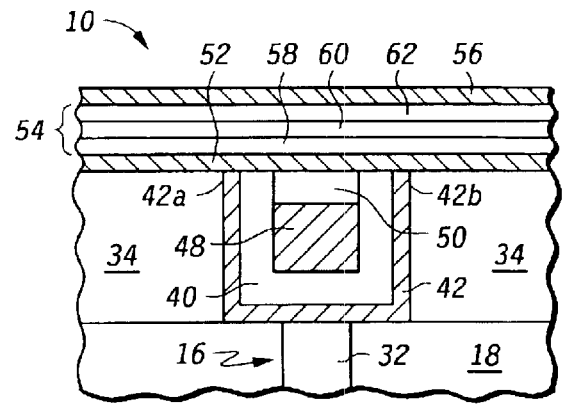

Referring to FIG. 8, a first conductive layer 52, a memory element layer 54 and a second conductive layer 56 are deposited overlying magnetic memory cell 10 with first conductive layer 52 in electrical contact with first end 42a and/or second end 42b of contact element 42. First conductive layer 52 comprises a non-magnetic conductor forming a lower electrical contact for a memory element to be subsequently formed and is deposited with a thickness of about 100 to about 4000 angstroms. First conductive layer 52 may comprise any suitable electrically conductive material. Preferably, first conductive layer 52 comprises tantalum (Ta), tungsten (W), titanium (Ti), or aluminum (Al), or combinations or alloys thereof, such as, for example, tantalum nitride (TaN).

Memory element layer 54 comprises materials that form the memory element, such as, for example, an MTJ element. In one exemplary embodiment of the invention, memory element layer 54 may comprise a first magnetic layer 58, a tunnel barrier layer 60, and a second magnetic layer 62, which may be deposited overlying first conductive layer 52 using methods such as, for example, physical vapor deposition (PVD), ion beam deposition, and the like. First and second magnetic layers 58 and 62 may comprise any number of magnetic materials, such as nickel (Ni), iron (Fe), cobalt (Co) or alloys thereof Alternatively, first and second magnetic layers 58 and 62 may comprise a composite magnetic material, such as nickel-iron (NiFe), nickel-iron-cobalt (NiFeCo) or cobalt-iron (CoFe) or alloys thereof, for example. Additionally, first and second magnetic layers 58 and 62 may comprise other materials, such as platinum (Pt), iridium (Ir), manganese (Mn), aluminum (Al), ruthenium (Ru), osmium (Os) or tantalum (Ta) or combinations or alloys thereof. Tunnel barrier layer 60 preferably comprises aluminum oxide ($AlO_x$, where $0<x\leq1.5$), but any number of insulators or semiconductors, such as aluminum nitride or oxides of nickel, iron, cobalt or alloys thereof, can be used in accordance with the present invention. First magnetic layer 58 serves as a hard magnetic layer, magnetization in which is pinned or fixed, whereas magnetization directions in second magnetic layer 62 are free to be switched between two magnetic states. Tunnel barrier layer 60 may be formed by the following methods. An aluminum film is deposited over first magnetic layer 58, then the aluminum film is oxidized by an oxidation source, such as RF oxygen plasma.

As another method, aluminum is deposited together with oxide on first magnetic layer 58, and then oxidation is carried out in oxygen ambient either heated or unheated. First and second magnetic layers 58 and 62 have thicknesses in the range from about 5 to about 500 angstroms. The thickness of tunnel barrier layer 60 ranges from about 5 to about 30 angstroms. Additional information as to the fabrication and operation of MTJ memory elements can be found in U.S. Pat. No. 5,734,605, entitled "Multi-Layer Magnetic Tunneling Junction Memory Cells," issued Mar. 31, 1998, and incorporated herein by reference.

Second conductive layer 56 is deposited overlying memory element layer 54. Second conductive layer 56 typically has a thickness in the range of about 100 to about 4000 angstroms and comprises any suitable electrically conductive material. Preferably, second conductive layer 56 comprises tantalum (Ta), tungsten (W), titanium (Ti), aluminum (Al), tantalum nitride (TaN), or combinations or alloys thereof.

Figure 9:
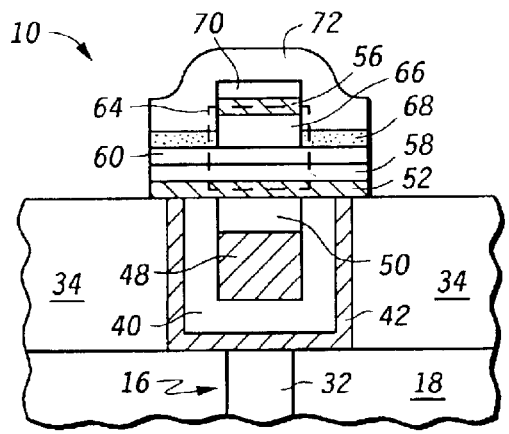

Referring to FIG. 9, layers 52, 54 and 56 are subsequently patterned and etched to form an individual memory element 64, such as an individual MTJ element, overlying first conductive layer 52 and underlying second conductive layer 56. Memory element 64 is disposed within magnetic memory cell 10 so as to be magnetically coupled to digit line 48. In one exemplary embodiment of the invention, an individual MTJ element 64 may be formed as follows. A first masking layer 70 may be deposited overlying second conductive layer 56 and may be patterned and etched using standard and well-known techniques so as to define the lateral dimensions of MTJ element 64. Second conductive layer 56 then may be etched such that its lateral dimensions correspond to the lateral dimension of patterned first masking layer 70. Second conductive layer 56 may be etched using a dry etch, an ion milling process or reactive ion etching (RIE).

Second magnetic layer 62 then may be partially etched using a dry etch and the remaining exposed portion of second magnetic layer 62 is changed into a material containing dielectric properties utilizing either oxidation or nitridation techniques. More specifically, the exposed portion of second magnetic layer 62 is transformed into an insulative portion 68. During the process of transforming the exposed portion of second magnetic layer 62 into an insulative portion 68, the first masking layer protects the unexposed portion of second magnetic layer 62 so that, after the oxidation or nitridation takes place, an active portion 66 is defined, which remains metallic, and an inactive portion or dielectric insulator 68 is defined where the now insulative portion is located. Additional information regarding the oxidation and nitridation of magnetic materials to form insulative materials can be found in U.S. Pat. No. 6,165,803, entitled "Magnetic Random Access Memory and Fabrication Method Thereof," issued Dec. 26, 2000, and incorporated in its entirety herein by reference. The lateral dimensions of the active portion 66 correspond to the lateral dimensions of the concurrently formed MTJ element 64, which comprises active portion 66, tunnel barrier layer 60 and first magnetic layer 58.

In an alternative exemplary embodiment of the invention, the exposed portion of second magnetic layer 62 may be transformed as described above without the partial etching of second magnetic layer 62 if second magnetic layer 62 is sufficiently thin so that the exposed portion of second magnetic layer 62 is rendered insulative upon oxidation or nitridation.

A blanket second masking layer 72 may be deposited overlying cell 10 and may be suitably patterned and etched using standard and well known techniques, such as photolithography techniques. The insulative portion 68 of second magnetic layer 62, tunnel barrier 60, first magnetic layer 58 and first conductive layer 52 may be etched to give the structure illustrated in FIG. 9. First conductive layer 52 is suitably etched so that it is in electrical communication with contact element 42. At least a portion of second masking layer 72 and first masking layer 70 then may be removed to expose at least a portion of second conductive layer 56 so that electrical contact may be made to second conductive layer 56. It will be understood that the aforementioned method for fabricating memory element 64 is exemplary in nature and it will be appreciated that memory element 64 may be formed by any other manner suitable for forming a memory element such as an MTJ element or a GMR element.

Figure 13:
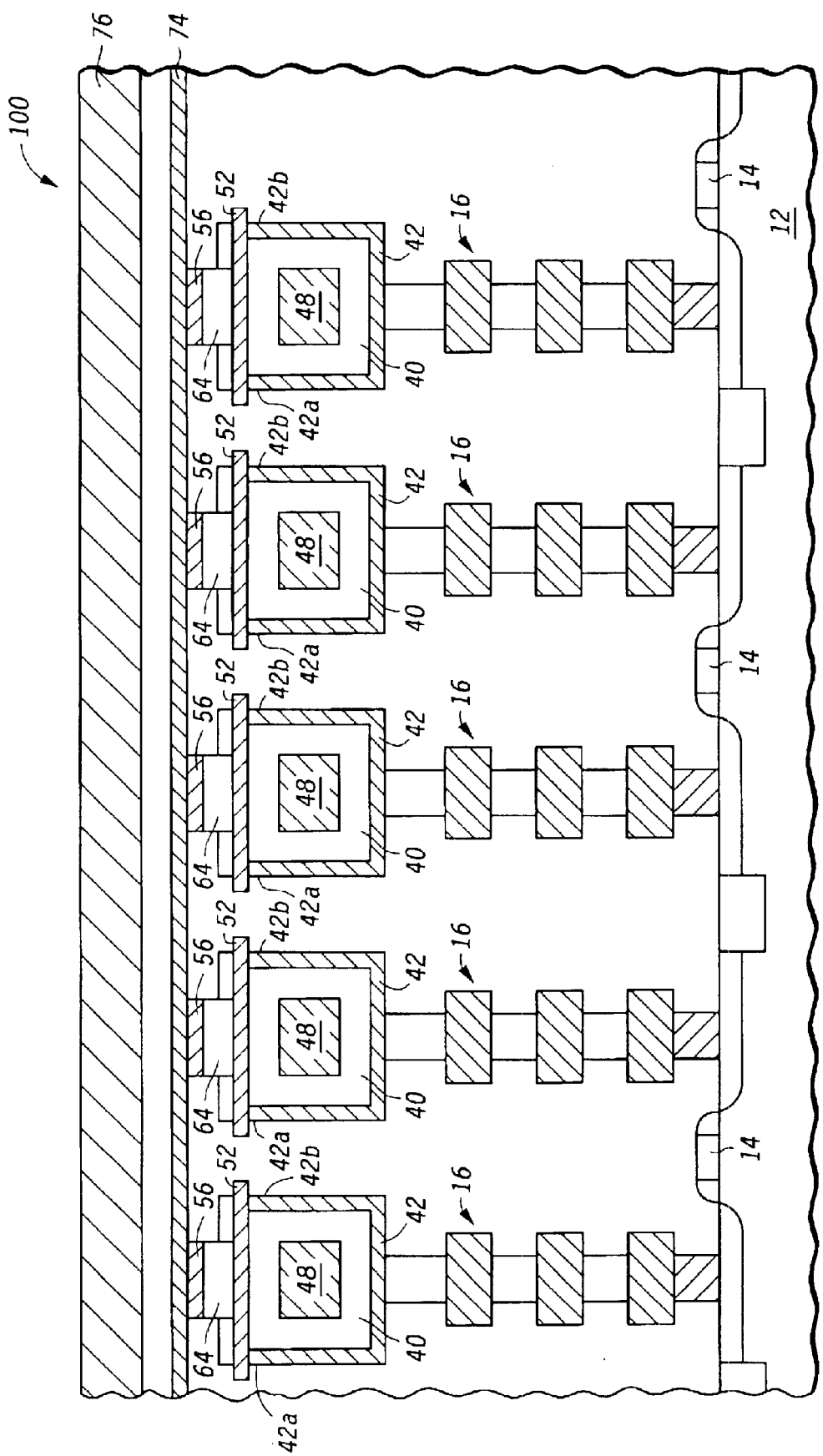
FIG. 13 is a simplified sectional view of an array of memory cells of a magnetoresistive random access memory device in accordance with an exemplary embodiment of the present invention.

FIG. 13 illustrates a simplified sectional view of a portion of an array 100 of MRAM cells 10 in accordance with an exemplary embodiment of the present invention. Elements of FIG. 13 that have the same reference numbers as FIGS. 1–12 are the same as the corresponding FIGS. 1–12 elements. While a portion of only one array of MRAM cells is illustrated in FIG. 13 for convenience, it will be appreciated that an MRAM device may comprise any suitable number of such arrays. Each MRAM cell 10 has associated therewith an interconnect stack 16 and a transistor 14, all formed on and supported by a substrate 12, as explained above. Each interconnect stack 16 is in electrical communication with a contact element 42, which has a first end 42a and a second end 42b. Contact elements 42 partially surround and are electrically isolated from digit lines 48. Digit lines 48 underlie first conductive layers 52, which are in electrical communication with first ends 42a and second ends 42b of contact elements 42. MRAM cell 10 further has memory elements 64 overlying first conductive layers 52 and second conductive layers 56 overlying memory elements 64. The MRAM cells are electrically connected by a metal interconnect layer 74, which is connected through an interconnect stack (not shown) to one of the transistors 14 (not shown). A bit line 76, associated with each row (or column) of array 100 is connected through an interconnect stack (not shown) to one of the transistors 14 (riot shown). Here it should be understood that one digit line 48 is associated with each column (or row) of array 100. While lines 48 and 76 are referred to herein as "digit lines" and "bit lines", respectively, for convenience, it will be understood that these titles could be reversed or changed in specific applications (e.g., program lines) and are not intended to in any way limit the invention.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A magnetoresistive random access memory cell comprising:

a substrate having a transistor formed therein;

a contact element electrically coupled to said transistor;

a digit line partially surrounded by and electrically isolated from said contact element, said digit line overlying a portion of said contact element; and a conductive layer overlying said digit line and in electrical communication with said contact element.

2. The magnetoresistive random access memory cell of claim 1, further comprising an interconnect stack in electrical communication with said transistor and said contact element.

3. The magnetoresistive random access memory cell of claim 1, said contact element having a first end and a second end, said conductive layer in electrical communication with said first end and said second end of said contact element.

4. The magnetoresistive random access memory cell of claim 1, wherein said contact element comprises at least one selected from the group comprising tantalum, tungsten, titanium, aluminum, tantalum nitride, titanium nitride and titanium tungsten.

5. The magnetoresistive random access memory cell of claim 1, wherein said contact element comprises a material of sufficiently high permeability to concentrate a magnetic flux produced by current flowing through said digit line in a desired area.

6. The magnetoresistive access memory cell of claim 1, wherein said contact element comprises nickel iron.

7. The magnetoresistive random access memory cell of claim 1, the contact element comprising a first barrier layer, a cladding layer and a second barrier layer.

8. The magnetoresistive random access memory cell of claim 1, said digit line comprising at least one material selected from the group comprising aluminum, aluminum alloys, copper and alloys.

9. The magnetoresistive random access memory cell of claim 1, further comprising a memory element overlying said conductive layer, said memory element magnetically coupled to said digit line.

10. The magnetoresistive random access memory cell of claim 1, further comprising a cladding disposed partially about and adjacent to said digit line.

11. A magnetoresistive random access memory device comprising:

a substrate having a plurality of transistors formed therein;

a plurality of electrically coupled magnetoresistive random access memory cells, each cell comprising:

a contact element in electrical communication with one of said plurality of transistors, said contact element having a first end and a second end;

a digit line partially surrounded by and electrically isolated from said contact element;

a first conductive layer overlying said digit line and in electrical communication with said first end and said second end of said contact element;

a memory element overlying said first conductive layer and magnetically coupled to said digit line; and a second conductive layer overlying said memory element.

12. The magnetoresistive random access memory device of claim 11, wherein said contact element comprises at least one material selected from the group comprising tantalum, tungsten, titanium, aluminum, tantalum nitride, titanium nitride and titanium tungsten.

13. The magnetoresistive random access memory device of claim 11, wherein said contact element of sufficiently high permeability to concentrate a magnetic flux produced by current flowing through said digit line in a desired area.

14. The magnetoresistive random access memory device of claim 11, wherein said contact elemental comprises nickel iron.

15. The magnetoresistive random access memory device of claim 11, the contact element comprising a first barrier layer, a cladding layer and a second barrier layer.

16. The magnetoresistive random access memory device of claim 11, said memory element comprising a magnetic tunnel junction element.

* * * * *